(12) United States Patent
Smiley (10) Patent No.: US 8,009,753 B2
(45) Date of Patent: Aug. 30, 2011

(54) SYSTEM AND METHOD FOR AUTOMATIC COMPENSATION OF VIDEO SIGNALS

(75) Inventor: Charles R. Smiley, Northridge, CA (US)

(73) Assignee: Xantech Corporation, Sylmar, CA (US)

( * ) Notice: Subject to any disclaimer, the term of this patent is extended or adjusted under 35 U.S.C. 154(b) by 1387 days.

(21) Appl. No.: 11/519,392

(22) Filed: Sep. 12, 2006

(65) Prior Publication Data

US 2008/0063090 A1 Mar. 13, 2008

(51) Int. Cl.
*H04B 7/02* (2006.01)
(52) U.S. Cl. .......................... 375/267; 375/259; 375/257
(58) Field of Classification Search .................. 375/259, 375/257, 267
See application file for complete search history.

(56) References Cited

U.S. PATENT DOCUMENTS

4,427,996 A * 1/1984 Tamura ...................... 348/229.1
5,036,387 A * 7/1991 Umezawa ..................... 348/635
* cited by examiner

*Primary Examiner* — Juan A Torres
(74) *Attorney, Agent, or Firm* — DLA Piper LLP (US)

(57) ABSTRACT

A system for delivering signal, such as video signal, over signal carrier, such as twisted-pair cable. The system includes a video source connected to a terminal of the signal carrier and providing video signals thereto. An amplifier is coupled to a second terminal of the signal carrier at the receiving end. A source reference signal generator is connected to a first terminal of a second signal carrier. A second amplifier is connected to a second terminal of the second signal carrier at the receiving end. A comparator is connected to an output of the second amplifier and a receiver reference signal. An output of the comparator is provided to a gain control of the variable gain amplifier.

42 Claims, 5 Drawing Sheets

SYSTEM AND METHOD FOR AUTOMATIC COMPENSATION OF VIDEO SIGNALS

BACKGROUND OF THE INVENTION

1. Field of the Invention

The present invention relates to systems and methods for delivering signals, such as video signals, over a signal carrier, and systems and methods for compensating for the losses sustained by those signals in their delivery.

2. Description of the Related Art

When delivering and/or transmitting a signal over a signal carrier and over some distances, whether the signal carrier be a signal-carrying wire or a channel in wireless communication, the delivered/transmitted signal inevitably suffers loss, or attenuation, during delivery/transmission through the signal carrier medium.

One method of compensating the attenuation is to measure the received signal, and feed the signal or other information back to the source of the signal for compensation. However, such a solution is disadvantageous where there may be a plurality of receiving points along the delivery/transmission path. Because the loss at each of the receiving points may be different, the signal source cannot be amplified to compensated properly for all the receiving points.

The attenuation issue is exemplified by the delivery of the video signal, such as the standard definition (SD) video signals in National Television System Committee (NTSC), Phase Alternating Line (PAL), and SECAM standards. The issue is exacerbated with emerging high definition (HD) video signals, which operate at over 30 MHz, and sustain significantly more attenuation in the delivery thereof. Viewers are affected by the signal loss, because the quality of the pictures suffers if the losses are not compensated.

The video signals may be carried on a physical medium, such as a cable. One type of video signal cable is the twisted-pair cable, such as the Category 5 cable (CAT-5). The CAT-5 cable includes four individual twisted-pair cables in a single cable jacket. Another type of cable is the coaxial cable. The twisted-pair cable has a pricing advantage over the coaxial cables, such as RG-6 cables. For delivering component video having Y, Y-r, and Y-b signals, three coaxial cables are typically needed. Whereas, only one four-twisted-pair cable is needed to carry the same signals.

Moreover, a video delivery system using coaxial cables typically uses single-ended drivers and receivers. In contrast, a system using twisted-pair cables typically uses differential drivers and receivers, and therefore offers the advantage of reduced ground loop noise. In particular, common mode noise from local interference may be canceled out at the receiving ends in a video delivery system with twisted-pair cables.

A twisted-pair cable having multiple twisted-pair wire lines, such as the CAT-5 cable, offers an additional advantage of having a fourth twisted-pair that can be used to carry a companion audio feed, such as that of Sony/Philips Digital Interface format (SPDIF) digital audio output. Most DVD players and HD set-top boxes have an SPDIF digital audio output in addition to the component video outputs.

Moreover, many buildings have been pre-wired with CAT-5 cables, and utilization of those cables for video application can minimize the installation cost and effort.

Accordingly, it has become increasingly desirable to use twisted-pair cables for video delivery. Twisted-pair cables such as CAT-5 cables have until now been associated with LAN network interconnectivity, and using this type of cable for video signal requires the design of appropriate cable drivers and receivers.

However, twisted-pair cables suffer from the aforementioned signal attenuation issue far more than the coaxial cables, even for the highest grade CAT twisted-pair cables. For example, Belden 1872A "MediaTwist" cable is marked "tested to 350 MHz." However, the signal attenuation for that cable is rated 39.8 dB for a 100-meter length at 350 MHz. For 60 MHz signals, the attenuation is still rated at 15 dB.

Another prior solution to the attenuation problem of carrying video signals over twisted-pair cables include using a receiving amplifier with adjustable frequency gain. The system installer would manually set several switches that control the gain of the receiving amplifier, for specific lengths of twisted-pair cables. The switch settings are dependent on the length and grade of the particular cable, due to variations of signal attenuation that exist in each cable. An installer would might measure the signals using specialized signal generation and measurement equipment to appropriately set the switches for each installation. The switches generally provide a discrete form of compensation that is invariably less than optimal. Furthermore, as signal transmission conditions change, such as may and are likely occur with changes in temperature, such manual customized compensation often loses much or all of its intended effect. Moreover, manually setting the gain level of receiving amplifiers is subject to human error and cannot be assured for each and every installation.

Also, low frequency signal loss, which is largely caused by the I-R drop of the cable, has not been adequately resolved by prior solutions. Video displays are expected to correct the low frequency signal loss by measuring the synch-tip amplitude and resealing the video to compensate for the loss.

Prior solutions thus require a combination of substantial time, skill, and/or equipment for installing each cable. Accordingly, a system that can compensate for signal loss in a signal carrier at multiple receiving locations is needed. Moreover, a system that can automatically compensate for signal loss independent of the physical characteristics of the carrier media is also needed.

SUMMARY OF THE INVENTION

Accordingly, objectives of the present invention include addressing the above-identified issues. One objective is to provide a system and method for delivering signals over a signal carrier, either wireless or wired, such as a twisted-pair cable, coaxial cable or other signal transmitting medium, with automatic signal-loss compensation.

In accordance with the foregoing objectives, one aspect of the present invention includes a system for delivering a signal over a signal carrier including a signal source coupled to a first transmitting terminal of the signal carrier. An amplifier is coupled to a second receiving terminal of the signal carrier, and a source reference signal is coupled to a first terminal of a second signal carrier. A second amplifier is coupled to a second receiving terminal of the second signal carrier, and a comparator is coupled to an output of the second amplifier and a receiver reference signal. An output of the comparator is coupled to a gain control of the amplifier.

Another aspect of the present invention is a system for delivering a signal over a signal carrier, including a signal source coupled to a first or transmitting terminal of the signal carrier. An amplifier is coupled to a second or receiving terminal of the signal carrier, and a source reference signal is coupled to a first terminal of a second signal carrier. A second source reference signal also is coupled to the first terminal of the second signal carrier. A second amplifier is coupled to a second terminal of the second signal carrier and a comparator is coupled to an output of the second variable gain amplifier and a receiver reference signal. A second comparator coupled to the output of the second amplifier and a second receiver reference signal. An output of the comparator is coupled to a gain control of the amplifier, and an output of the second comparator is coupled to a second gain control of the amplifier.

A third aspect of the present invention provides a method for delivering a signal over a signal carrier including the steps of providing a signal to a first terminal of the signal carrier, receiving and amplifying the signal at a second terminal of the signal carrier, providing a source reference signal to a first terminal of a second signal carrier, receiving and amplifying the source reference signal at a second terminal of the second signal carrier, providing a receiver reference signal, comparing the amplified source reference signal and the receiver reference signal and generating a correction signal, and adjusting the amplification of the received high frequency signal in accordance with the correction signal.

In a fourth separate aspect, a method for delivering a signal over a signal carrier is provided. The method includes steps of providing a signal to a first terminal on the signal carrier, receiving and amplifying the signal at a second terminal of the signal carrier, providing a source reference signal to a first terminal of a second signal carrier, receiving and amplifying the source reference signal at a second terminal of the second signal carrier, providing a second source reference signal at a first terminal of a second signal carrier, receiving and amplifying the second source reference signal at the second terminal of the second signal carrier, providing first and second receiver reference signals, comparing the amplified source reference signal and the first receiver reference signal and generating a first correction signal, comparing the amplified second source reference signal and the second receiver reference signal and generating a second correction signal, adjusting the amplification of the received high frequency signal in accordance with the first correction signal, and adjusting a second amplification of the received high frequency signal in accordance with the second correction signal.

In a fifth separate aspect, a system for delivering a signal over a signal carrier having a first and a second terminal is provided. A signal source is coupled to a first terminal of the signal carrier. An amplifier is coupled to a second terminal of the signal carrier. A source reference signal generator is also coupled to the first terminal of the signal carrier. A comparator is coupled to an output of the amplifier and a receiver reference signal generator. An output of the comparator is coupled to a gain control of the amplifier.

Further embodiments as well as modifications, variations, and enhancements of the invention are also described hereon.

DESCRIPTION OF THE PREFERRED EMBODIMENTS

Referring to the FIGS. 1-5, preferred embodiments of the present invention are described herein. In the preferred embodiments, the delivered signal is a high-definition (HD) video signal and the signal carrier is a twisted-pair cable. However, other signal types and transmitting media may be used without departing from the scope of the present invention.

Figure 1:
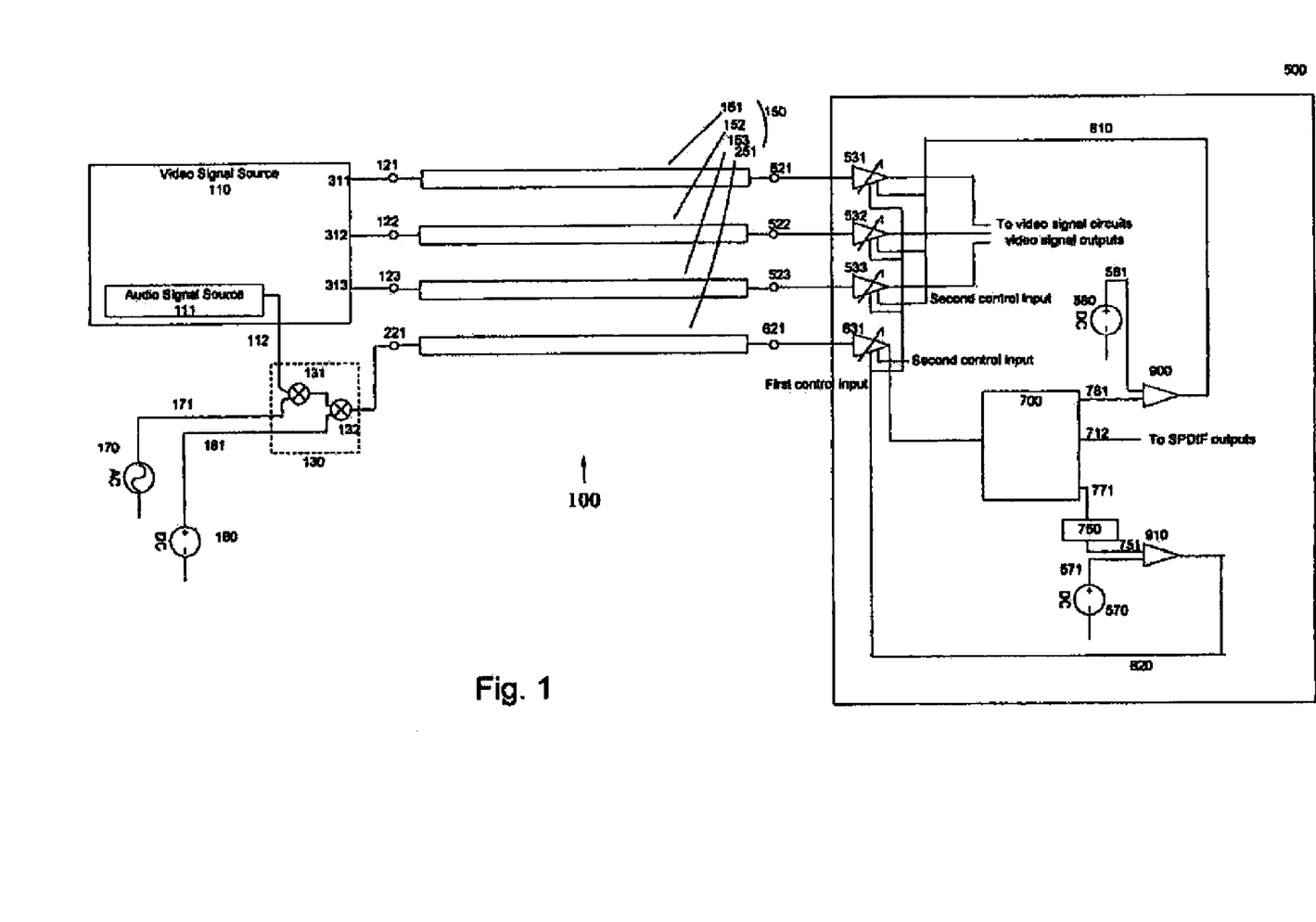
FIG. 1 is a schematic illustrating a preferred embodiment of a system for delivering high-frequency signals over twisted-pair cables.

FIG. 1 depicts a preferred embodiment of a system 100 of delivering high frequency video signal by a CAT-5 twisted-pair cable. The system 100 preferably includes four pairs of twisted-pair wire lines in a single cable jacket. A CAT-5 twisted-pair cable 150 includes four pairs of twisted-pair wire lines 151, 152, 153, 251. A high frequency video signal source 110 is connected to terminals 121, 122, 123 of twist-pairs of wire lines 151, 152, 153, and provides component video signals Y 311, Y-r 312, and Y-b 313 respectively. The high frequency video signal source 110 is preferably a video source such as a TV, Set-top box, or DVD player, etc. Generally the fourth twisted pair wire line 251 is unused for the component video signals. The video signal source 110 may be, for example, a received broadcast HDTV signal. The HD format may be 720p60 (720 lines per frame, progressive encoding, 60 frames per second), 1080i (1080 lines per frame, interlaced encoding, frames per second varies), 1080p or other HD formats, including to-be-instituted digital formats such as "2K" and "4K" which have been proposed.

The video source preferably also has an audio signal source 111 producing a digital audio signal 112, preferably in SPDIF format. A SPDIF digital audio signal has a clock rate of two to three Megahertz (MHz), therefore reproducing second and third harmonics of the SPDIF digital audio signal 112 only requires a bandwidth of up to 10 MHz. An AC reference signal circuit 170 provides an AC source reference signal 171.

Figure 2:
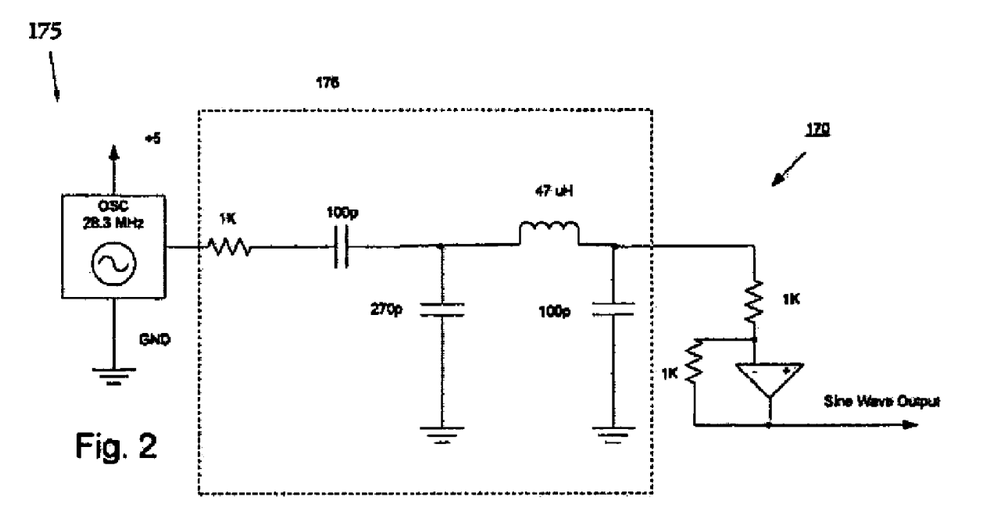
FIG. 2 is a schematic illustrating a preferred embodiment of an AC source reference signal circuit exemplified in FIG. 1.

FIG. 2 illustrates one preferred embodiment of an AC source reference signal circuit 170, including a standard DIP package oscillator 175 with TTL output levels. The oscillator output is connected to a band-pass filter 176 that reduces the 2nd and 3rd harmonics more than 50 dB. An AC signal generator is well known to those of ordinary in the art. FIG. 2 provides one such example.

The AC source reference signal 171 preferably is a 28.322 MHz sine wave with low harmonic content. The preferred frequency of 28.322 MHz is selected to be below the Federal Communications Commission (FCC) radio frequency interference low limit of 30 MHz. The reduced second and third harmonics are in the FCC part 15 evaluation range and below Class B limits. The selected frequency is also supported by widely available standard oscillators from many sources. Operationally, however, other frequencies optionally may be used to measure losses, including high frequency losses, inherent to the type of signal carrier used, and no specific or special frequency is required.

A DC reference signal circuit 180 preferably generates a DC source reference bias 181. The DC source reference bias 181, the AC source reference signal 171, and the SPDIF digital audio signal 112 are preferably coupled by a mixer circuit 130, and provided to a transmitting terminal 221 of the fourth pair twisted-pair wire line 251. The frequency of AC source reference signal 171, noted above in one embodiment as being 28.322 MHz, is well above the digital audio signal frequency (2-3 MHz) carried by the fourth twisted pair line, and thus preferably represents an unused frequency band. The mixer circuit 130 is illustrated as including two two-signal mixers 131 and 132. Other methods of coupling the signals that are well known to those of ordinary skill in the art are optionally used. The SPDIF digital audio signal 112 requires no DC response and thus can be capacitance-coupled onto the fourth pair of twisted-pair wire lines 251 with the DC source reference bias 181 and the AC reference signal 171. In this case, the AC source reference signal 171 has significantly higher frequency than the DC source reference bias 181 and the SPDIF digital audio signal 112. Therefore the AC source reference signal 171 is a carrier of the coupled signal.

The coupled DC source reference bias 181, the AC source reference signal 171, and the SPDIF digital audio signal 112, and the component video signals Y 311, Y-r 312, and Y-b 313 respectively preferably are carried by the CAT-5 twisted-pair cable 150, and received by receivers in a receiving apparatus 500.

The receiving apparatus 500 preferably includes signal amplifiers. The signal amplifiers are preferably variable gain amplifiers 531, 532, and 533, and respectively connected to individual terminals 521, 522, and 523 of twist-pairs of wire lines 151, 152, 153. The variable gain amplifiers 531, 532, and 533 respectively receive component video signals Y 311, Y-r 312, and Y-b 313, and amplify them depending on the first and second control inputs. The first control input of the variable gain amplifier determines the gain for frequency compensation. The second control input of the variable gain amplifier determines the gain for DC or low frequency compensation.

The outputs of the variable gain amplifiers 531, 532, and 533 are provided to an additional video signal circuit not shown in FIG. 1. The video circuits may, for example, include a three-element low-pass filter to quiet the noise floor above 80 MHz. The noise floor will inherently be higher with longer cable, requiring more high frequency compensation. The noise floor rises to a peak of around 110 MHz if it is not filtered. Since, generally, no meaningful signals will be produced above 100 MHz, it is advantageous to level off the frequency response beginning at 85 MHz. The filtered video signals are then output to the video signal output jacks for connection to a video display device.

The receiving apparatus 500 preferably also includes a variable gain amplifier 631, connected to individual terminals 621 of twist-pairs of wire lines 251. The variable gain amplifier 631 preferably receives the coupled SPDIF digital audio signal 112, the DC source reference bias 181 and the AC source reference signal 171, and amplifies it in accordance with the first and second control inputs.

In one preferred embodiment, the variable gain amplifiers 531, 532, and 533 are implemented with a single Intersil EL9111 which includes three amplifiers. The variable gain amplifiers 631 are preferably implemented with the single version EL9110. The frequency response voltage input, the $V_{CTRL}$ pin, of EL9111 and EL9110 is the first control input. The overall gain voltage input, the $V_{GAIN}$ pin, is the second control input.

EL9111 and EL9110 allow for improved packaging and a higher level of system integration. Other methods conventional to implement the variable gain and variable compensation amplifiers may be used, and the EL9111 and EL9110 illustrate one implementation.

The output of the variable gain amplifier 631 is preferably connected to a signal splitter 700 that isolates received SPDIF digital audio signal 712, received DC source reference bias 781 and received AC source reference signal 771 from the received coupled signal. The signal splitter 700 is constructed of filters. A low-pass filter is preferably used to isolate the received DC source reference bias from the coupled signal. A band-pass filter is preferably used to isolate the received AC source reference signal 771 from the coupled signal. A deep notch filter is preferably used to remove the received AC source reference signal component and isolate the received SPDIF digital audio signal 712. The received SPDIF digital audio signal 712 is then output to the SPDIF output jack for connection to an audio device. The designs of the filters and the signal splitter 700 are well known in the art.

The receiving apparatus 500 further includes an DC receiver reference voltage circuit 570 generating an DC receiver reference voltage 571 at the receiving end, and a DC receiver reference voltage circuit 580 generating a DC receiver reference voltage 581 at the receiving end.

The received AC source reference signal 771 is preferably then compared to a known reference signal generated in the receiving apparatus 500 (DC receiver reference voltage 571 in this embodiment). A correction signal/voltage is generated as a result of the comparison, and feeds back to the variable gain amplifiers 531, 532, 533, and 631, by connecting to the first control inputs of the amplifiers. The amplifiers adjust their high frequency compensation gain in accordance with the correction signal/voltage. Accordingly, the system described herein provides an apparatus and method of automatic high frequency signal loss compensation for any lengths of cable carrying a high frequency/video signal. An advantage of providing the automatic compensation in the receiving system is that the incremental cost of the enhancement is minimized.

In the preferred embodiment, received AC source reference signal 771 is first provided to a frequency-to-RMS-voltage converter 750. Preferably, the converter is an Analog Device AD8361 IC that measures the carrier's RMS (Root Mean Square) value and converts it into a proportionate DC voltage 751. The proportionate DC voltage 751 preferably is then provided to a comparator 910. The comparator is preferably a circuit or other device that compares two signals' various attributes. The comparator may be, for example, a difference, error or differential amplifier, an operational amplifier, or a device that outputs a digital "0" and "1," depending on the comparison of two signals. In one preferred embodiment, the comparator is a differential amplifier that compares the DC voltages of two signals. The output of the comparator is preferably a proportional indicator, such as voltage level, that reflects the difference between, for example, the amplitudes of the signals being compared.

The receiving apparatus 500 includes an DC receiver reference voltage circuit 570 generating an DC receiver reference voltage 571 at the receiving end. The DC receiver reference voltage 571 is preferably a DC voltage set as a target of the high frequency attenuation compensation. Preferably, the AC receiver reference voltage is set as to compare to proportionate DC voltage 751. The proportionate DC voltage 751 a scaled DC voltage from the frequency-to-RMS-voltage converter 750 that represents the RMS value of the received AC source reference signal 771. The target RMS voltage for a −6 dB signal of the source reference 28.322 MHz signal delivered in a short (1-meter) cable is −0.522 V, and is the preferred DC receiver reference voltage 571.

Figure 3:
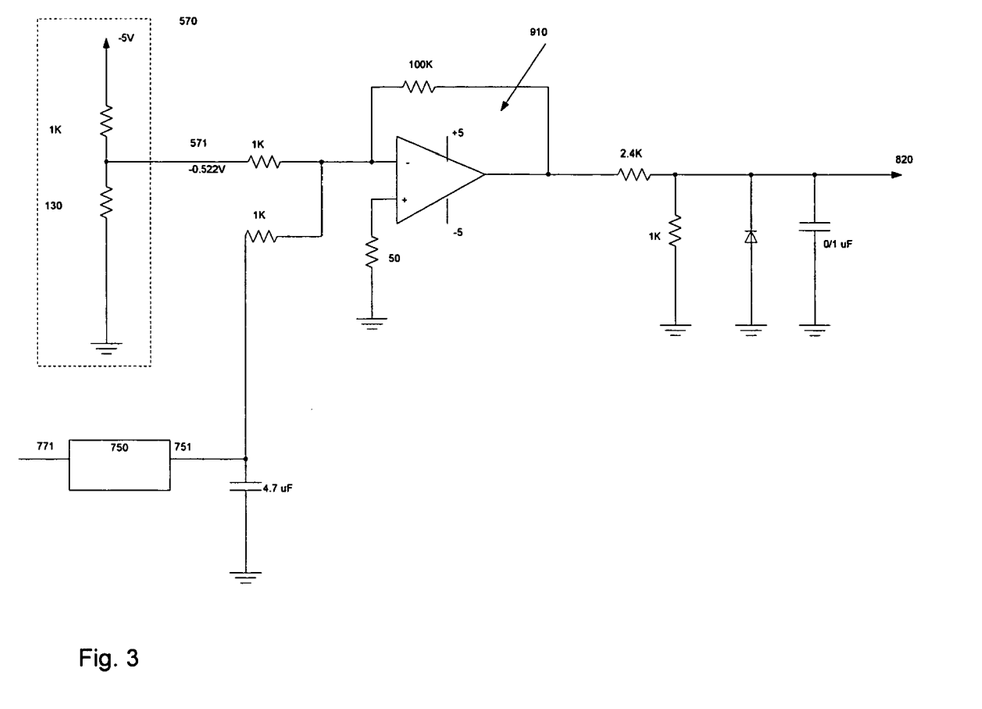
FIG. 3 is a schematic illustrating a preferred embodiment of a portion of the receiving apparatus exemplified in FIG. 1.

In a preferred embodiment, the comparators 900 and 910 are implemented using operational amplifiers. FIG. 3 is a schematic illustrating one embodiment of the circuits for the comparator 910 and the DC receiver reference voltage circuit 570. The comparator 910 compares the proportionate DC voltage 751 to the DC receiver reference voltage 571, and generates a compensation control signal. In the preferred embodiment, the compensation control signal is the DC correction voltage 820. As used herein, compensation control is characterized by a signal that changes the transfer characteristics of a device in response to a control signal, for example, a control signal that would change the gain across multiple frequencies for each signal level. The DC correction voltage 820 is provided to the first control input of the variable gain amplifiers 531, 532, 533, and 631. The feedback of the DC correction voltage 820 to the variable gain amplifier 631 forms a closed servo loop for frequency compensation, which is used to adjust all four channels. The AC source reference signal 171 traverses a path having similar characteristics, such as the length, routing, and impedance, as the video signals, and therefore provides more accurate compensation of the signal loss.

A DC receiver reference voltage circuit 580 preferably generates a DC receiver reference bias 581 at the receiving end. The received DC source reference bias 781, extracted from splitter 700, is provided to a comparator 900 and compared with DC receiver reference bias 581. The comparator 900 generates a DC correction voltage 810, which preferably is provided to the second control input of the variable gain amplifiers 531, 532, and 533.

The low-frequency-signal losses are generally due to current-resistance (IR) drops in the cables. The typical CAT-5 cable has been measured to have 28-ohm per thousand feet on a single conductor. For a balanced differential line, the impedance is 56 ohms. The CAT-5 cable is driven with a 100-Ohm source and terminated with a 100-ohm load resistance to match the characteristic impedance. This signal drop across the cable resistance causes the low amplitude of the low frequency signals. Many video displays can correct this signal loss by measuring the synch-tip amplitude and resealing the video to compensate for the loss. The system 100 preferably automatically adjusts for the IR loss, and thus reduces the processing burden for the video displays.

In the preferred embodiment illustrated in FIG. 1, it is well understood by the persons of ordinary skill in the art that the receiving apparatus 500 is one or a plurality of receiving devices connected to different terminals of the twist-pair cables 151, 152, 153. Similarly, the high frequency video signal source 110 may be one or a plurality of video sources.

In alternative embodiments, outputs of the variable gain amplifiers 531, 532, and 533, which amplify the received component video signals Y 311, Y-r 312, and Y-b 313 respectively, are provided to additional circuits such as filters, and to video signal output jacks.

Test results for CAT-5E Belden 1583A cable demonstrate that the present system provides high-frequency-corrected-3 dB at 60 MHz for lengths over 1000 feet.

In one alternative embodiment, a small microprocessor (e.g. a PIC processor) is used in the receiving apparatus. The proportionate DC voltage 751 extracted from the received AC reference signal and the received DC reference bias 781 are read by the analog-to-digital (A/D) ports of the microprocessor. The digital values of the two signals are then used to index into more complex tables of values of AC correction voltage 820 and DC correction voltage 810, thus providing even more precise compensation.

Moreover, the two correction voltages are alternatively generated by the microprocessor. Rather than adding the cost of digital-to-analog (D/A) converters, the microprocessor's internal counter-timers form variable duty-cycle signals on I/O output pins that are integrated into the DC correction voltages.

In this embodiment, the source AC reference signal is generated wherein an Analog Devices AD9859 Direct Digital Synthesizer integrated circuit (IC) is preferably used to generate bursts frequencies from 5 to 50 MHz. The generation would only occur at power up conditions for a brief interval. The expected frequency burst at the receiving end then is measured and tabulated to characterize the type and the length of the cable.

The new AD8128 differential-receiver IC from Analog Devices™ has multi-pole frequency compensation DC control inputs. These ICs generally have less adjustment range. They may be cascaded by using two devices per received signal. The Analog Device ADA4410-6 active video filter ICs have two inputs for each of the three component video signals. A control line may select if one or both AD8128 differential-receiver ICs are used to process the signal, providing greater flexibility in precise compensation for different grades and lengths of CAT cables.

The inclusion of the ADA4410-6 active video filter ICs allows 6th order roll-off of the unwanted frequencies above high-definition (HD) video bandwidth requirement. Such greatly lowers the noise floor that would naturally be raised by the frequency compensation needed for very long lengths of poor quality CAT cable.

Figure 4:
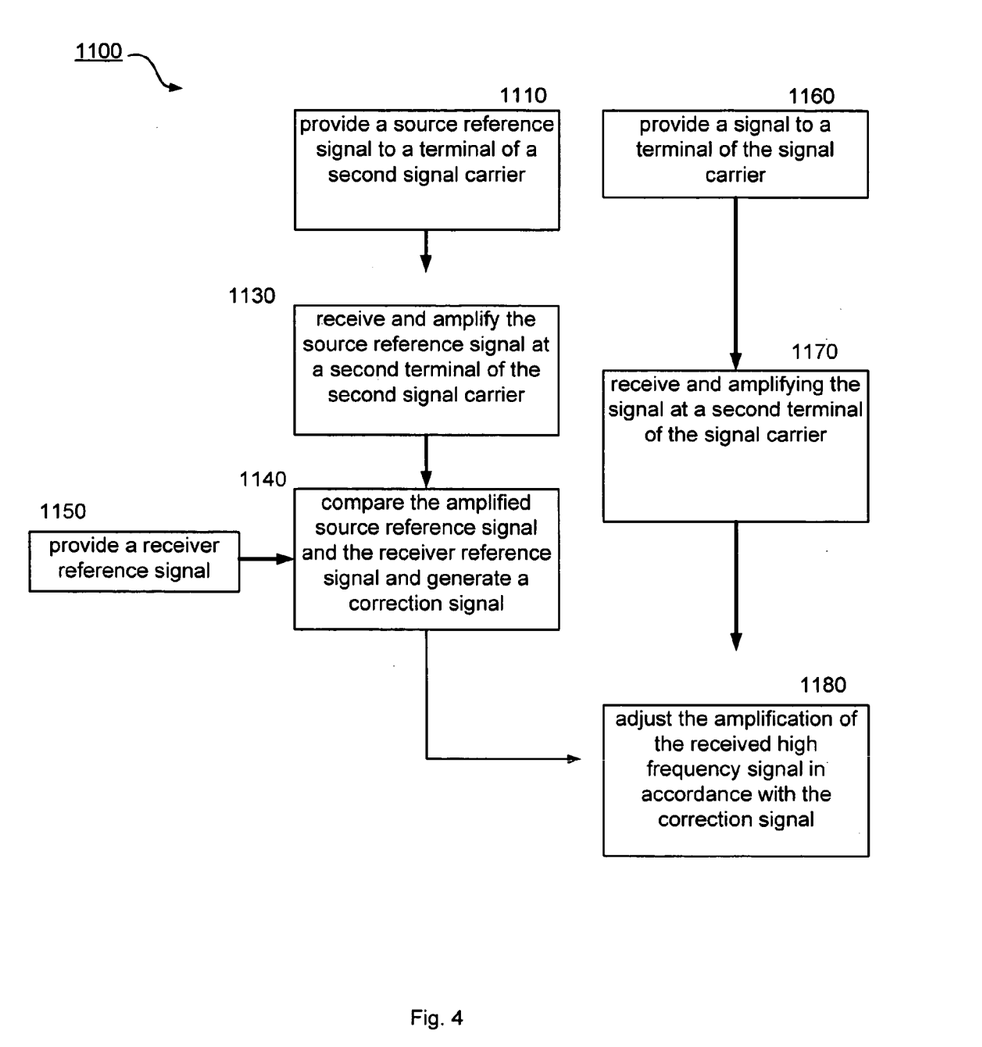
FIG. 4 is a flow diagram illustrating a preferred embodiment of a method of delivering high-frequency signals over twisted pair cables, preferably employed by the system of FIG. 1.

FIG. 4 is a flow diagram illustrating a preferred embodiment of a method 1100 of delivering signals over a signal carrier. In step 1160, a signal is provided to an input terminal of the signal carrier. The signal may be video signals originating from a video source such as a TV or DVD player. In step 1170, that signal is received and amplified at the receiver terminal of the signal carrier. An amplifier is preferably used for the receiving and amplification of the signal. In step 1110, a source reference signal is provided to the input terminal of a second signal carrier. The source reference signal may be an AC signal having a known AC frequency, and generated by an AC signal generator. In step 1130, the source reference signal is received and amplified at the receiver terminal of the second signal carrier. An amplifier is usually used for the receiving and amplification of the source reference signal. In step 1150, a receiver reference signal is provided. The receiver reference signal may be an AC signal having another known, or target, AC frequency. In step 1140, the amplified source reference signal and the receiver reference signal are compared, and a correction signal preferably is generated in accordance with the comparison. In step 1180, the amplification of the received signal is adjusted in accordance with the correction signal. The amplification may be, for example, the AC gain of the amplifier.

Figure 5:
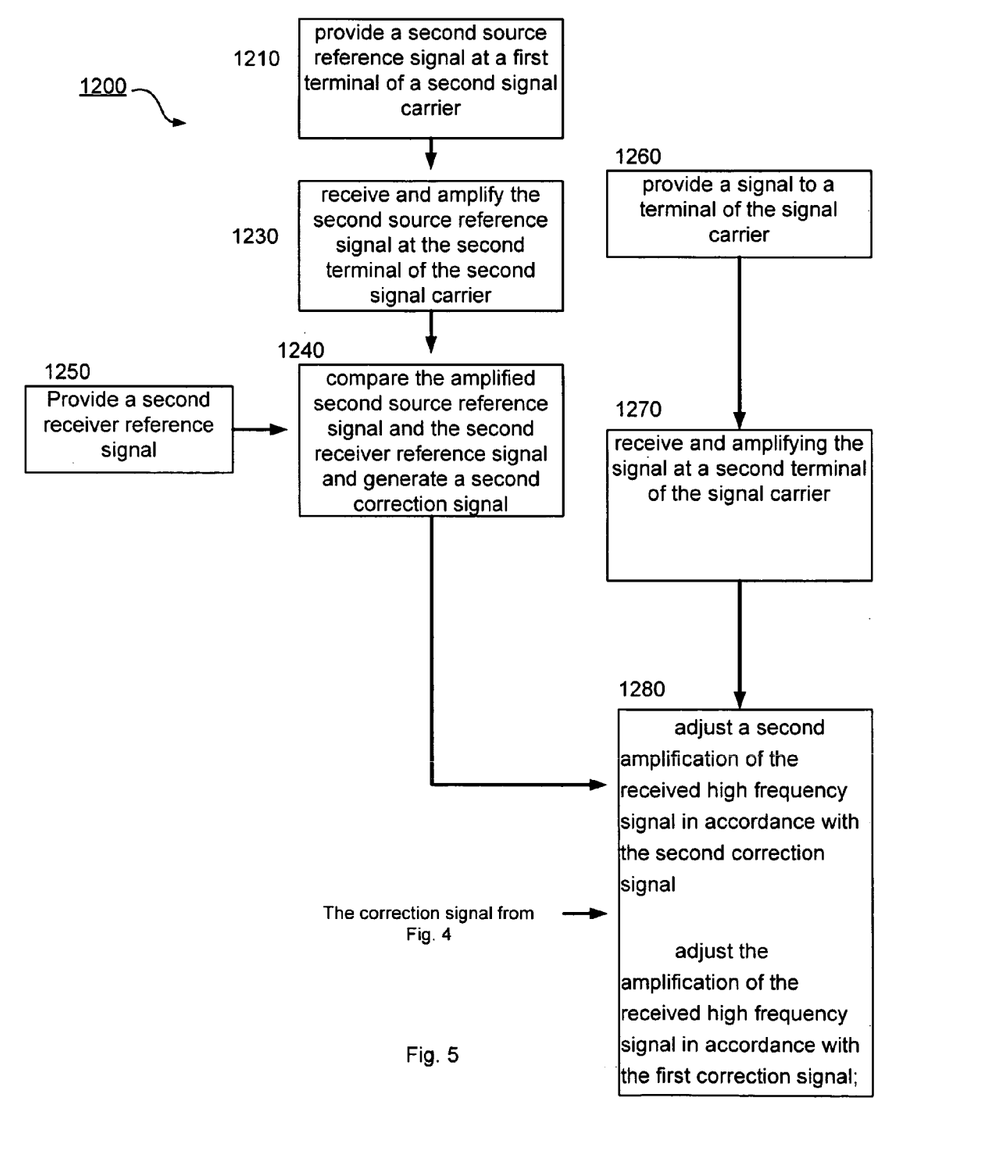
FIG. 5 is a flow diagram illustrating another preferred embodiment of a method of delivering high frequency signals over twisted pair cables.

FIG. 5 is flow diagram illustrating another preferred embodiment of a method 1200 of delivering signals over a signal carrier. In step 1260, a signal is provided to an input terminal of the signal carrier. The signal may be video signals from a video source such as a TV or DVD player. In step 1270, that signal is received and amplified at the receiver terminal of the signal carrier. An amplifier is preferably used for the receiving and amplification of the signal. The steps 1260 and 1270 of FIG. 5 are similar to steps 1160 and 1170, respectively, of FIG. 4. In step 1210, a second source reference signal is provided to the input terminal of the second signal carrier. The second source reference signal may be a DC bias, and generated by an DC voltage generator. In step 1230, the second source reference signal is received and amplified at the receiver terminal of the second signal carrier. An amplifier is preferably used for the receiving and amplification of the source reference signal. In step 1250, a second receiver reference signal preferably is provided. The second receiver reference signal may be a DC bias having another known, or target, DC voltage level. In step 1240, the amplified second source reference signal and the second receiver reference signal are compared, and a second correction signal is generated in accordance with the comparison. In step 1280, the amplification of the received signal is adjusted in accordance with the correction signal. The amplification may be, for example, the AC gain of the amplifier. A second type of amplification is further provided by the second correction signal. The second type of amplification may be, for example, the DC gain of the amplifier.

Many modifications and variations of the present invention are possible in light of the above teaching. Accordingly, with the scope of the appended claims, the present invention may be practiced other than as specifically described.

What is claimed is:

1. A system for delivering a signal over a signal carrier having a first terminal and a second terminal, the system comprising:
    a signal source coupled to a first terminal of the signal carrier;
    a first amplifier coupled to a second terminal of the signal carrier;
    a source reference signal generator coupled to a first terminal of a second signal carrier;
    a second amplifier coupled to a second terminal of the second signal carrier; and
    a comparator coupled to an output of the second amplifier and a receiver reference signal generator;
    wherein an output of the comparator is an input to the first amplifier and the second amplifier, and the first and second amplifiers provide compensation control in response to the input.

2. The system for delivering a signal over a signal carrier of claim 1, wherein the output of the second amplifier operates to assure that the difference between the output of the receiver reference signal generator and the output of the second amplifier is minimized.

3. The system for delivering a signal over a signal carrier of claim 1, wherein the frequency of the output from the source reference signal generator is selected to measure losses inherent to the type of signal carrier.

4. The system for delivering a signal over a signal carrier according to claim 1, wherein the source reference signal generator generates a DC bias.

5. The system for delivering a signal over a signal carrier according to claim 1, wherein the signal is a video signal.

6. The system for delivering a signal over a signal carrier according to claim 5, further comprising an audio signal also coupled to the first terminal of the second signal carrier.

7. The system for delivering a signal over a signal carrier according to claim 6, wherein the source reference signal generator generates an AC signal having a reference frequency, and wherein the output of the comparator is also coupled to a compensation control of the second amplifier.

8. The system for delivering a signal over a signal carrier according to claim 6, wherein the source reference signal generator generates a DC bias.

9. The system for delivering a signal over a signal carrier according to claim 7, wherein the video signal is in component video format comprising of a plurality of component video signals, and the signal carrier comprises a plurality of twisted-pair cables, and the amplifier comprises a plurality of component amplifiers.

10. The system for delivering a signal over a signal carrier according to claim 9, wherein the signal carrier and the second signal carrier comprise Category 5 cables.

11. A system for delivering a signal over a signal carrier having first and second terminals, the system comprising:
    a signal source coupled to a first terminal of the signal carrier;
    a first amplifier coupled to the second terminal of the signal carrier;
    a first source reference signal generator coupled to a first terminal of a second signal carrier;
    a second source reference signal generator also coupled to the first terminal of the second signal carrier;
    a second amplifier coupled to a second terminal of the second signal carrier;
    a first comparator coupled to an output of the second amplifier and a receiver reference signal; and
    a second comparator coupled to the output of the second amplifier and a second receiver reference signal;
    wherein an output of the first comparator is an input to the first amplifier and the second amplifier, and the first and second amplifiers provide compensation control in response to the input, and wherein an output of the second comparator is coupled to a gain control of the first amplifier.

12. The system for delivering a signal over a signal carrier of claim 11, wherein the output of the second amplifier operates to assure that the difference between the output of the receiver reference signal generator and the output of the second amplifier is minimized.

13. The system for delivering a signal over a signal carrier of claim 11, wherein the frequency of the output from the first source reference signal generator is selected to measure losses inherent to the type of signal carrier.

14. The system for delivering a signal over a signal carrier according to claim 11, wherein the signal is a video signal.

15. The system for delivering a over a signal carrier according to claim 11, further comprising an audio signal coupled to the first terminal of the second signal carrier.

16. The system for delivering a signal over a signal carrier according to claim 15, wherein the first source reference signal generator generates an AC signal having a reference frequency, and wherein the output of the first comparator is also coupled to a gain control of the second amplifier.

17. The system for delivering a signal over a signal carrier according to claim 16, wherein the second source reference signal generator generates a DC bias.

18. The system for delivering a signal over a signal carrier according to claim 17, wherein an audio signal output is also coupled to the first terminal of the signal carrier.

19. The system for delivering a signal over a signal carrier according to claim 18, wherein a video signal is in component video format comprising of a plurality of component video signals, and the signal carrier comprises a plurality of twisted-pair cables, each of the plurality of twisted-pair cables carrying a different component of the video signal, and the amplifier comprises a plurality of component amplifiers.

20. The system for delivering a signal over a signal carrier according to claim 19, wherein the signal carrier and the second signal carrier comprise Category 5 cables.

21. A method for delivering a signal over a signal carrier comprising the steps of:
    (a) providing the signal to a first terminal of the signal carrier;
    (b) receiving and amplifying a high frequency signal at a second terminal of the signal carrier;
    (c) providing a source reference signal to a first terminal of a second signal carrier;
    (d) receiving and amplifying the source reference signal at a second terminal of the second signal carrier;

(e) providing a receiver reference signal;
(f) comparing the amplified source reference signal and the receiver reference signal and generating a correction signal; and
(g) adjusting the compensation of the received high frequency signal in accordance with the correction signal.

22. The method for delivering a signal over a signal carrier according to claim 21, wherein in the source reference signal is an AC signal having a reference frequency, and further comprising the step of adjusting the compensation of the received source reference signal in accordance with the correction signal.

23. The method for delivering a signal over a signal carrier according to claim 22, wherein the step of adjusting the compensation of the received source reference signal and the step of adjusting the compensation of the received high frequency signal are substantially synchronous.

24. The method for delivering a signal over a signal carrier according to claim 21, wherein the source reference signal is a DC bias.

25. The method for delivering a signal over a signal carrier according to claim 21, wherein the signal is a video signal.

26. The method for delivering a signal over a signal carrier according to claim 21, further comprising the step of providing an audio signal to the first terminal of the second signal carrier.

27. The method for delivering a signal over a signal carrier according to claim 26, wherein in the source reference signal is an AC signal having a reference frequency, and further comprising the step of adjusting amplification of the received source reference signal in accordance with the correction signal.

28. The method for delivering a signal over a signal carrier according to claim 26, wherein the source reference signal is a DC bias.

29. The method for delivering a signal over a signal carrier according to claim 28, wherein a video signal is in component video format comprising of a plurality of component video signals, the signal carrier comprises a plurality of twisted-pair cables, each of the plurality of twisted-pair cables carrying a different component of the video signal.

30. The method for delivering a signal over a signal carrier according to claim 29, wherein the signal carrier and the second signal carrier comprise Category 5 cables.

31. A method for delivering a signal over a signal carrier comprising the steps of:
(a) providing a high frequency signal to a first terminal of the signal carrier;
(b) receiving and amplifying the high frequency signal at a second terminal of the signal carrier;
(c) providing a first source reference signal to a first terminal of a second signal carrier;
(d) receiving and amplifying the first source reference signal at a second terminal of the second signal carrier;
(e) providing a second source reference signal at a first terminal of a second signal carrier;
(f) receiving and amplifying the second source reference signal at the second terminal of the second signal carrier;
(g) providing first and second receiver reference signals;
(h) comparing the amplified first source reference signal and the first receiver reference signal and generating a first correction signal;
(i) comparing the amplified second source reference signal and the second receiver reference signal and generating a second correction signal;
(j) adjusting a first compensation of the received high frequency signal in accordance with the first correction signal; and
(k) adjusting a second compensation of the received high frequency signal in accordance with the second correction signal.

32. The method for delivering a signal over a signal carrier according to claim 31, wherein the signal is a video signal.

33. The method for delivering a signal over a signal carrier according to claim 32, further comprising the step of providing an audio signal to the first terminal of the second signal carrier.

34. The method for delivering a signal over a signal carrier according to claim 33, wherein in the first source reference signal is an AC signal having a reference frequency, and further comprising the step of adjusting the first compensation of the first received source reference signal in accordance with the first correction signal.

35. The method for delivering a signal over a signal carrier according to claim 34, wherein the second source reference signal is a DC bias.

36. The method for delivering a signal over a signal carrier according to claim 35, further comprising the step of providing an audio signal to the first terminal of the signal carrier.

37. The method for delivering a signal over a signal carrier according to claim 35, wherein the video signal is in component video format comprising of a plurality of component video signals, the signal carrier comprises a plurality of twisted-pair cables, each of the plurality of twisted-pair cables carrying a different component of the video signal.

38. The method for delivering a signal over a signal carrier according to claim 37, wherein the signal carrier and the second signal carrier comprise Category 5 cables.

39. A system for delivering a signal over a signal carrier having a transmitting terminal and a receiving terminal, comprising:
a signal source coupled to the transmitting terminal of the signal carrier;
an amplifier coupled to the receiving terminal of the signal carrier;
a source reference signal generator also coupled to the transmitting terminal of the signal carrier; and
a comparator coupled to an output of the amplifier and a receiver reference signal generator;
wherein an output of the comparator is coupled to a compensation control of the amplifier.

40. The system for delivering a signal over a signal carrier according to claim 39, wherein the source reference signal generator generates an AC reference signal having a reference frequency.

41. The system for delivering a signal over a signal carrier according to claim 40, wherein an other source reference signal generator generates a DC bias and couples to the transmitting terminal of the signal carrier.

42. The system for delivering a signal over a signal carrier according to claim 40, wherein the comparator comprises a differential amplifier.

* * * * *